(12) United States Patent
Taniguchi et al.

(10) Patent No.: US 7,139,176 B2
(45) Date of Patent: Nov. 21, 2006

(54) CIRCUIT SUBSTRATE AND METHOD FOR FABRICATING THE SAME

(75) Inventors: Osamu Taniguchi, Kawasaki (JP); Yasuo Yamagishi, Kawasaki (JP); Koji Omote, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/300,601

(22) Filed: Nov. 21, 2002

(65) Prior Publication Data

US 2003/0116857 A1    Jun. 26, 2003

(30) Foreign Application Priority Data

Dec. 26, 2001   (JP)   ............................ 2001-393573

(51) Int. Cl.
  *H05K 7/02*  (2006.01)
  *H05K 7/06*  (2006.01)

(52) U.S. Cl. .................. 361/760; 361/741; 361/730; 174/262; 174/260; 174/258

(58) Field of Classification Search ................ 361/748, 361/760, 765, 719, 720, 730, 750, 762, 741, 361/761; 174/262, 260, 266, 256, 258–259, 174/263, 250
See application file for complete search history.

(56) References Cited

U.S. PATENT DOCUMENTS 5,266,748 A * 11/1993 Kawakami et al. ......... 174/262
6,074,567 A * 6/2000 Kuraishi et al. ............... 216/18
6,323,439 B1 * 11/2001 Kambe et al. ............... 174/626
6,359,790 B1 * 3/2002 Meyer-Berg ................. 361/803
6,414,248 B1 * 7/2002 Sundstrom ................... 174/260
6,430,059 B1 * 8/2002 Hung et al. .................. 361/793
6,497,943 B1 * 12/2002 Jimarez et al. .............. 428/209
6,700,077 B1 * 3/2004 Chiang ........................ 174/262
6,713,184 B1 * 3/2004 Ferencz et al. ........... 428/423.7
6,717,070 B1 * 4/2004 Watanabe .................... 174/262
6,992,379 B1 * 1/2006 Alcoe et al. ................. 257/700
2002/0038725 A1 * 4/2002 Suzuki et al. ................ 174/262

FOREIGN PATENT DOCUMENTS

| JP | 2-39569   | 2/1990 |
| JP | 6-53414   | 2/1994 |
| JP | 6-169064  | 6/1994 |
| JP | 11-251320 | 9/1999 |

* cited by examiner

*Primary Examiner*—Elvin Enad
*Assistant Examiner*—Hung S. Bui
(74) *Attorney, Agent, or Firm*—Armstrong, Katz, Quintos, Hanson & Brooks, LLP

(57) ABSTRACT

A circuit substrate including a silicon substrate with through-holes formed therein, conducting films formed on the inside walls of the through-holes, and an organic resin film formed on the surface of at least one side of the silicon substrate and covering at least parts of the through-holes. Accordingly, even in a case where the through-holes formed, micronized at a small pitch, the substrate does not lower the mechanical strength. Thus, a circuit substrate which is applicable to high-density packaging can be provided.

18 Claims, 7 Drawing Sheets

CIRCUIT SUBSTRATE AND METHOD FOR FABRICATING THE SAME

CROSS-REFERENCE TO RELATED APPLICATIONS

This application is based upon and claims priority of Japanese Patent Application No. 2001-393573, filed on Dec. 26, 2001, the contents being incorporated herein by reference.

BACKGROUND OF THE INVENTION

1. Field of the Invention

The present invention relates to a circuit substrate and a method for fabricating the circuit substrate, more specifically to a circuit substrate and a method for fabricating the circuit substrate which are adaptable to higher density and higher speed.

2. Description of the Related Art

Recently, semiconductor parts used in computers, etc. are rapidly made increasingly adaptable to higher density and higher speed. Circuit substrates as well are accordingly required to be adaptable to the higher density and the higher speed.

One example of the conventional circuit substrates will be explained with reference to FIGS. 7A and 7B. FIG. 7A is a sectional view of the mounted conventional circuit substrate, which shows the structure of the circuit substrate. FIG. 7B is a perspective view of the circuit substrate, which shows the structure of the circuit substrate.

As shown in FIG. 7A, the circuit substrate 100 is mounted on a packaging substrate 106. The circuit substrate 100 and the packaging substrate 106 are electrically connected to each other via solder balls 104a, etc. A decoupling capacitor 108 is formed on the upper surface of the circuit substrate 100. An LSI substrate 110 is mounted on the circuit substrate 100 mounted on the packaging substrate 106. The circuit substrate 100 and the LSI substrate 110 are electrically connected to each other via solder balls 104b, etc.

As shown in FIG. 7B, through-holes 114 are formed in the circuit substrate 100 at a certain pitch. Vias 116 of a metal are buried in the through-holes 114. Usually, passive elements, active elements, etc., such as decoupling capacitors, etc., are formed on the circuit substrate 100 mounted on a packaging substrate 106. In FIG. 7B, these elements, etc. are omitted.

Prescribed interconnections of the LSI substrate 110 and prescribed interconnections of the packaging substrate 106 are electrically connected via the vias 116, electrode pads 102a, 102b and solder balls 104a, 104b.

The above-described circuit substrate generally comprises a resinous substrate, ceramic substrate, as of alumina ceramics, glass ceramics, or other substrates.

The resinous substrate is formed in the following way. First, copper foil internal plates which function as the interconnections, and sheets of carbon fibers impregnated with a thermosetting resin, which is called a prepreg are laid alternately the former on the latter. Then, the laid cooper foil internal layers plates and the prepregs are pressed and sintered to form the resinous substrate. Then the through-holes are formed by mechanical processing using a drill. Next, the surface is plated with copper.

The ceramic substrate is fabricated in the following way. First, a ceramic sheet before sintered, which is called a green sheet is punched to form openings. Then, the surface is plated with copper. Next, a plurality of the green sheets are laid one on another, and pressed and sintered.

Metal is buried by plating in the through-holes formed in the respective substrates to electrically connect the surface of the substrate and the backside of the substrate.

For higher density packaging, the through-holes formed in the substrate are required to have a smaller diameter and a smaller pitch. However, the circuit substrate formed of the resinous substrate or the sintered ceramic substrate has a limit to a smaller diameter of the through-holes and a pitch of the through-holes.

For the ceramic substrate, the through-holes are formed by mechanical processing using a punch, which makes it difficult to form the through-holes at a pitch smaller than a feed pitch of the punch.

For the resinous substrate, the through-holes are formed by mechanical processing using a drill, which makes it difficult to form the through-holes at a pitch smaller than a feed pitch of the drill. In a case where a thin drill is used to make the through-holes micronizsed, there is a risk that the drill may be broken when the through-holes are formed or the substrate itself may be broken. The risk that the substrate itself may be broken is higher when the through-holes are formed of a high aspect ratio are formed at a small pitch.

To bury a metal in the through-holes by plating, the growing velocity of the metal film is low. Accordingly, a long plating time is required. For example, when a metal is buried in the through-holes of a 50 μm-diameter and a 300 μm-depth, about 3 day of the plating are required.

In the case where the through-holes have a high aspect ratio, burying metal by the plating has the following disadvantage. That is, as an aspect ratio of the through-holes is higher, it is more difficult for a plating liquid to intrude into the through-holes, and part of the inside walls of the through-holes are not plated. Resultantly, the electric conductivity is less reliable.

For the resinous substrate, thermal processing of high temperatures generates contaminative gases from the substrate, and melts the substrate itself, which makes it difficult to form passive elements, such as capacitors, etc., on the resinous substrate. The ceramic substrate is formed by sintering, which causes disadvantages of inferior dimensional stability due to variable shrinkages, etc., voids formed in the meal interconnections, and other disadvantages. Such disadvantages make it difficult to apply the ceramic substrate to the micronized devices.

Here, it is considered to use a silicon substrate or a glass substrate in place of the above-described resinous substrate and ceramic substrate. For the silicon substrates, etc., micronized processing by photolithography can be used. Accordingly, more micronized through-holes can be formed in the silicon substrate, etc. than in the resinous substrate, etc. Furthermore, the silicon substrate and the glass substrate are the same material as the LSI chips, or the coefficients of linear expansion of the former are approximate to a linear expansion coefficient of the LSI chips, whereby the generation of stresses due to temperature changes are depressed. Advantageously, the reliability can be improved.

However, to bury metal by plating into the micronized through-holes formed in the silicon substrate, etc. it takes a long time, as does it in the case of the resinous substrates. There is a risk that simply forming the micronized through-holes at a small pitch may break the substrates themselves. Burying metal in the through-holes formed simply at a small pitch will damage the substrates due to stresses applied to the substrates due to the difference of thermal expansion coefficients.

SUMMARY OF THE INVENTION

An object of the present invention is to provide a circuit substrate and a method for fabricating the circuit substrate which is applicable to high-density packaging and can be fabricated for a short period of time.

According to one aspect of the present invention, there is provided a circuit substrate comprising: a substrate with a through-hole formed in; a conducting film formed on the inside wall of the through-hole and exposed in the cavity inside the through-hole; and a reinforcing film of an organic resin formed on the surface of at least one side of the substrate and covering at least a part of the opening of the through-hole.

According to another aspect of the present invention, there is provided a method for fabricating a circuit substrate comprising the steps of: forming a through-hole in a substrate; forming a conducting film on the inside wall of the through-hole, exposed in the cavity inside the through-hole; and forming a reinforcing film of an organic resin on the surface of at least one side of the substrate, covering the opening of the through-hole.

As described above, according to the present invention, no metal is buried in the through-holes, the conducting film is formed on the inside walls of the through-holes, electrically interconnecting the electrodes, the interconnections, etc. formed on both surfaces of the substrate, and the reinforcing film is formed, covering the through-holes, whereby even in a case where the through-holes formed, micronized at a small pitch, the substrate does not lower the mechanical strength. Thus, the circuit substrate which is applicable to high-density packaging can be provided.

DETAILED DESCRIPTION OF THE PREFERRED EMBODIMENTS

[A First Embodiment]

Figure 1A:
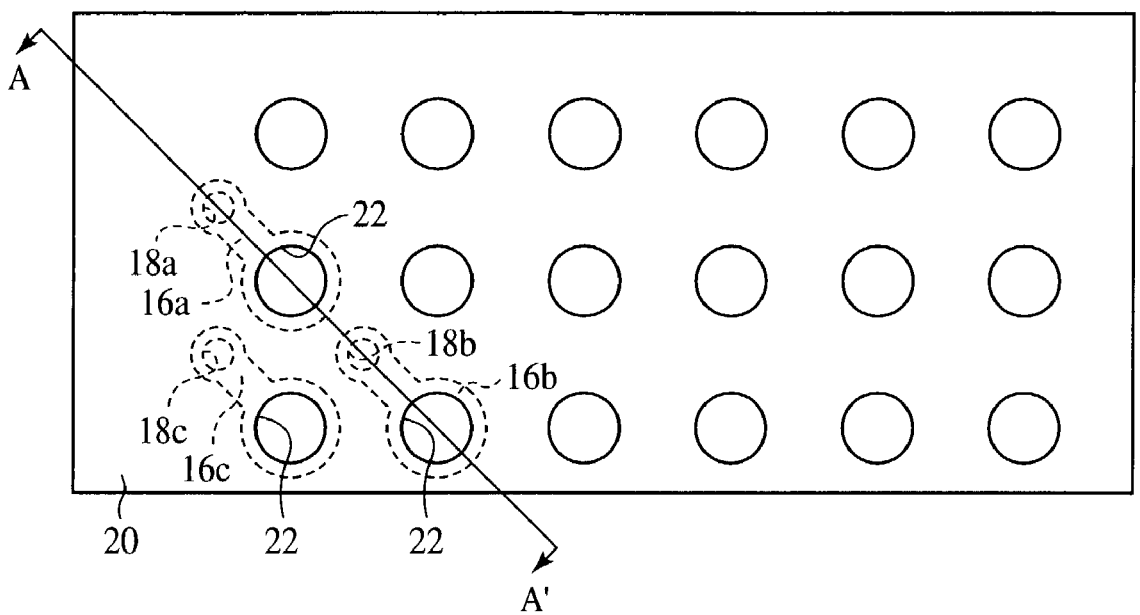
FIGS. 1A and 1B are diagrammatic views of the circuit substrate according to a first embodiment of the present invention, which show a structure thereof.
Figure 1B:
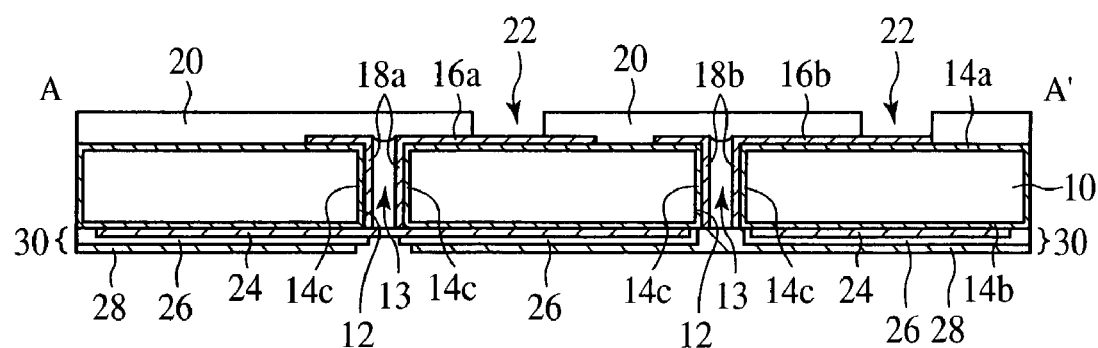

The circuit substrate according to a first embodiment of the present invention and the method for fabricating the circuit substrate will be explained with reference to FIGS. 1A, 1B, 2A, 2B, 2C, 2D, 3A, 3B, 3C, and 3D. FIGS. 1A and 1B are diagrammatic views of the circuit substrate according to the first embodiment.

(Circuit Substrate)

The circuit substrate according to the present embodiment will be explained with reference to FIGS. 1A and 1B. FIG. 1A is an upper side view of the circuit substrate according to the present embodiment. FIG. 1B is the sectional view along the line A–A' in FIG. 1A.

A shown in FIG. 1B, through-holes 12 are formed in a silicon substrate 10 at a prescribed pitch. Silicon oxide films 14a, 14b are formed on both sides of the silicon substrate 10. A silicon oxide film 14c is formed on the inside walls of the through-holes 12.

Interconnections 16a, 16b, 16c of a conducting film patterned in a prescribed shaped are formed on the upper surface of the silicon substrate 10 with the silicon oxide film 14a formed on. A number of the interconnections 16a, 16b, 16c are formed on the silicon substrate 10, but only three are shown in FIG. 1A.

As shown in FIGS. 1A and 1B, conducting films 18a, 18b, 18c are formed on the inside walls of the through-holes 12 with the silicon oxide film 14c formed on. The conducting films 18a, 18b, 18c are exposed inside the cavities of the through-holes 12.

The respective conducting films 18a, 18b, 18c are electrically connected to the respective interconnections 16a, 16b, 16c.

An organic resin film 20 is formed on the upper surface of the silicon substrate 10 with the interconnections 16a, 16b. 16c formed on, covering the openings 13 of the through-holes 12. The organic resin film 20 functions as a reinforcement film for reinforcing the mechanical strength of the circuit substrate with the through-holes 12 formed in. The organic resin film 20 can be formed of a material, such as a solder resist, which can be applied by printing, of a high viscosity of, e.g., above 20000 mPa·s. A film resist, which can be formed by pressing or heating, or can be affixed to the substrate by an adhesive, can be used.

The silicon substrate 10 whose strength is low because the through-holes 12 are not filled with a metal or others, is reinforced by the organic resin film 20, which is easy to process.

As shown in FIGS. 1A and 1B, a plurality of circular openings 22 are formed in the organic resin film 20 down to the interconnections 16a, 16b, 16c at a prescribed layout pattern.

An electrode pad and a solder ball (not shown) are to be formed in each opening 22.

Electrodes 24 are formed, patterned in a prescribed shape, on the backside of the silicon substrate 10 with the silicon oxide film 14b formed on.

The electrodes 24 are electrically connected to the interconnection 16a via the conducting film 18a formed on the inside walls of the through-holes 12.

A dielectric film 26 of BST ($Ba_xSr_{1-x}TiO_3$) is formed on the undersides of the electrodes 24. Electrodes are formed on the underside of the dielectric film 26. The electrodes 24, the dielectric film 26 and the electrodes 28 constitute a decoupling capacitors 30.

The electrodes 28 are electrically connected to the interconnections 16b via the conducting film 18b formed on the inside walls of the through-holes 12.

On the underside of the silicon substrate 10 with the capacitors 30 formed on, electrode pads and solder balls (not shown) are provided.

The circuit substrate has such structure.

An LSI substrate (not shown) is to be mounted on the upper surface of the circuit substrate according to the present embodiment.

The conducting film 18a is electrically connected to, e.g., the source line of the LSI via the interconnections 16a and the solder balls. The conducting film 18b is electrically connected to, e.g., the ground line of the LSI via the interconnections 16b and the solder balls. The conducting film 18c is electrically connected to, e.g., the signal lines of the LSI via the interconnections 16c and the solder balls.

The circuit substrate according to the present embodiment, on which the LSI substrate is mounted as described above, is mounted on a packaging substrate (not shown).

The conducting film 18a is electrically connected to, e.g., the source line of the packaging substrate via the electrodes 24 and the solder balls, etc. The conducting film 18b is electrically connected to, e.g., the source line of the packaging substrate via the electrodes 28 and the solder balls, etc.

Thus, the prescribed interconnections of the LSI substrate mounted on the circuit substrate according to the present embodiment are connected to the prescribed lines of the packaging substrate via the interconnections 16a, 16b, 16c, the conducting films 18a, 18b, 18c, etc.

As described above, one of major characteristics of the circuit substrate according to the present embodiment is that the through-holes 12 are not buried with metal, but the circuit substrate comprises the conducting films 18a, 18b, 18c formed on the inside walls of the through-holes 12, and the organic film 20 formed, covering the openings 13 of the through-holes 12. The circuit substrate having the through-holes 12 buried with metal has take long time to be fabricated. In contrast to this, according to the present embodiment, without burying metal in the through-holes 12, the interconnections 16a, 16b, 16c and the electrodes 24, 28 are connected by the conducting films 18a, 18b, 18c formed on the inside walls of the through-holes 12, whereby the circuit substrate can be fabricated in a shorter time.

Metal whose thermal expansion coefficient is different from that of the silicon substrate 10 is not buried in the through-holes 12, whereby the generation of stresses caused in the circuit substrate in thermal processing of high temperatures can be depressed.

Because of the organic resin film 20 covering the openings of the through-holes 12, waviness and bowing of the substrate can be depressed, whereby the circuit substrate can retain high mechanical strength.

The organic resin film 20 is formed easily by printing or other means, whereby the circuit substrate can be easily reinforced.

(Method for Fabricating Circuit Substrate)

Then, the method for fabricating the circuit substrate according to the present embodiment will be explained with reference to FIGS. 2A, 2B, 2C, 2D, 3A, 3B, 3C, and 3D.

First, a silicon substrate 10 of, e.g., a 300 μm-thickness is thermally oxidized to form the silicon oxide films 14a, 14b of a 1 μm-thickness on both sides of the silicon substrate 10.

Figure 2A:
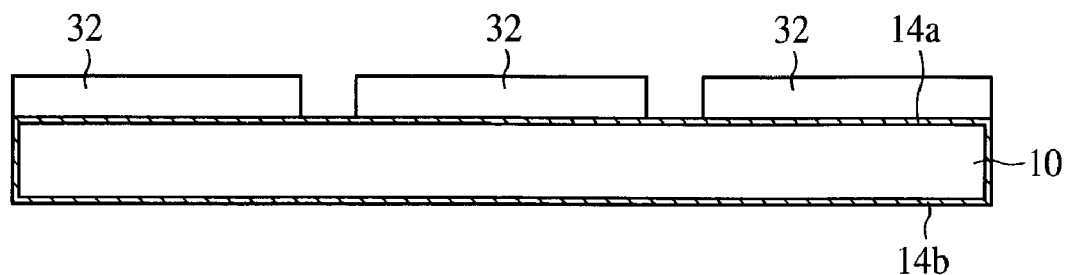
FIGS. 2A, 2B, 2C, and 2D are sectional views of the circuit substrate according to the first embodiment of the present invention in the steps of the method for fabricating the circuit substrate, which show the method (Part 1).

Then, a resist film 32 is formed on one side of the silicon substrate 10 with the silicon oxide films 14a, 14b formed on. Next, a pattern for forming the through-holes 12 is formed by photolithography (FIG. 2A). A pitch of the pattern may be, e.g., 223 μm. A diameter of the pattern can be 50 μm.

Next, the silicon oxide film 14a is etched by, e.g., reactive ion etching (RIE) with the resist film 32 as a mask.

Then, the silicon substrate 10 is etched by RIE at a high selectivity ratio with respect to the silicon oxide film 14b.

Figure 2B:
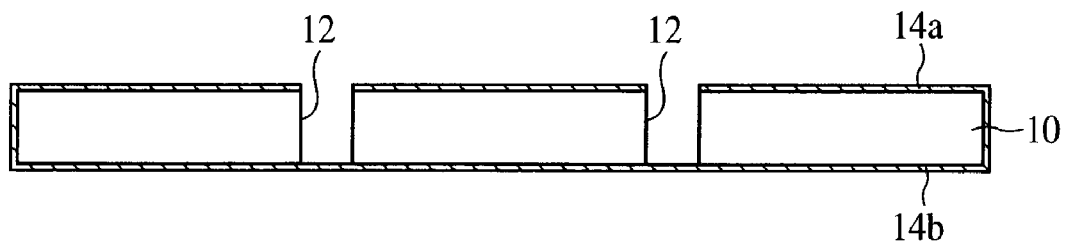

Thus, the through-holes 12 are formed in the silicon substrate 10. The silicon oxide film 14b formed on the underside of the silicon substrate 10 remains not etched (FIG. 2B).

As described above, according to the present embodiment, the through-holes 12 are formed in the silicon substrate 10 by lithography. Accordingly, the through-holes 12 can be formed, further micronized at a smaller pitch than the through-holes 12 formed by the conventional mechanical processing using a drill. The through-holes 12 can be formed applicable to the high density packaging.

According to the present embodiment, the silicon substrate 10 is selectively etched without etching the silicon oxide film 14b formed on the underside of the silicon substrate 10, whereby the silicon substrate 10 can be reinforced. Accordingly, even when the through-holes 12 are formed, micronized at a small pitch, the silicon substrate 10 is prevented from breaking when the through-holes 12 are formed in.

Figure 2C:
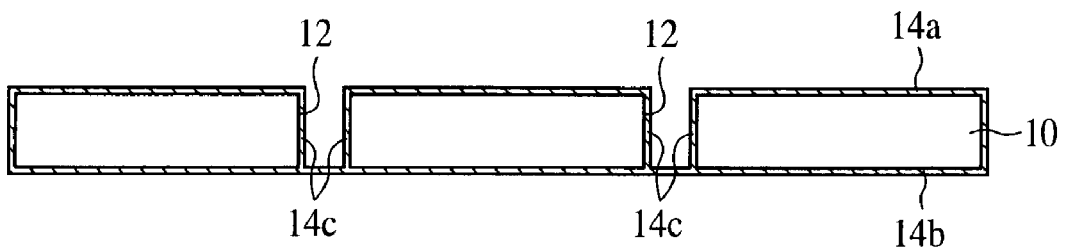

Then, the silicon substrate 10 is again thermally oxidized to form the silicon oxide film 14c on the inside walls of the through-holes 12 (FIG. 2C).

Figure 2D:
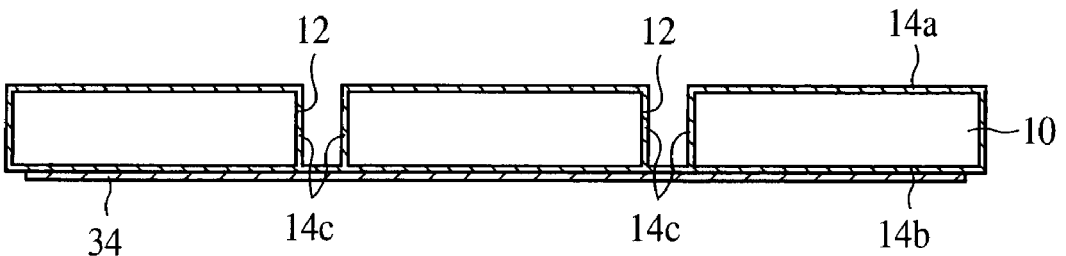

Next, the conducting film 34 is formed of, e.g., Ti, Cr, Cu or others by, e.g., sputtering or CVD (Chemical Vapor Processing) on the underside of the silicon substrate 10 with the silicon oxide film 14b formed on (FIG. 2D).

Figure 3A:
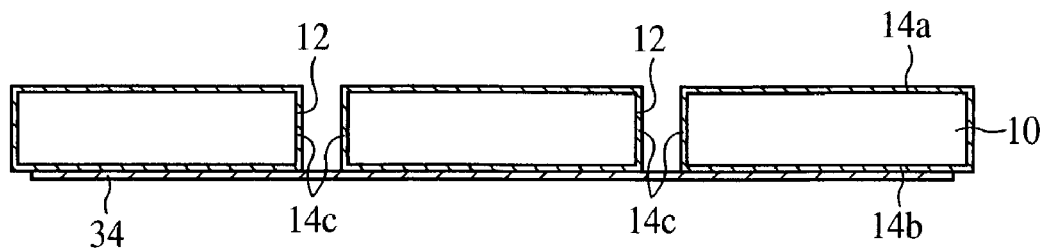
FIGS. 3A, 3B, 3C, and 3D are sectional views of the circuit substrate according to the first embodiment of the present invention in the steps of the method for fabricating the circuit substrate, which show the method (Part 2).

Then, the silicon oxide film 14b exposed in the through-holes 12 are etched (FIG. 3A).

Next, a conducting film is formed on the upper surface of the silicon substrate 10 with the silicon oxide film 14a formed on and on the inside walls of the through-holes with the silicon oxide film 14c formed on. The conducting film is formed, e.g., by forming a seed layer of Ni by sputtering or others, and then growing a metal film of Au by electrolytic plating.

The conducting film can be formed also by the following processing. First, a fatty acid organometal solution of Cu fine particles of a 10 nm-order size is applied to the silicon oxide films 14a, 14c and then, the silicon oxide films 14a, 14c are dried by a 10 minute-heat treatment. This processing is repeated several times to form a 0.2 μm-thickness Cu film. Then, a 0.5 μm-thickness Pt film or Au film is formed by electrolytic plating. Thus, the conducting film of the layered film can be formed.

Next, the conducting film formed on the upper surface of the silicon substrate 10 is patterned in a prescribed shape.

Figure 3B:
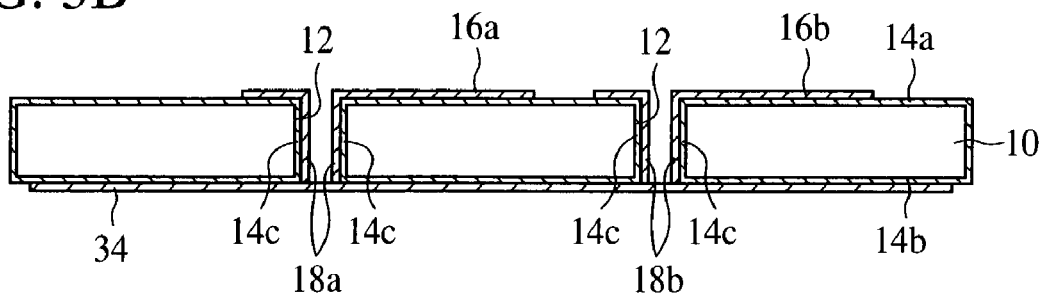

Thus, the interconnections 16a, 16c, 16c are formed on the upper surface of the silicon substrate 10 (see FIG. 1A) while the conducting films 18a, 18b, 18c are formed on the inside walls of the through-holes 12 (FIG. 3B).

Then, the conducting film 34 formed on the underside of the silicon substrate 10 is patterned in a shape of the electrodes 24. Thus, the electrodes 24 are formed of the conducting film 34.

Figure 3C:
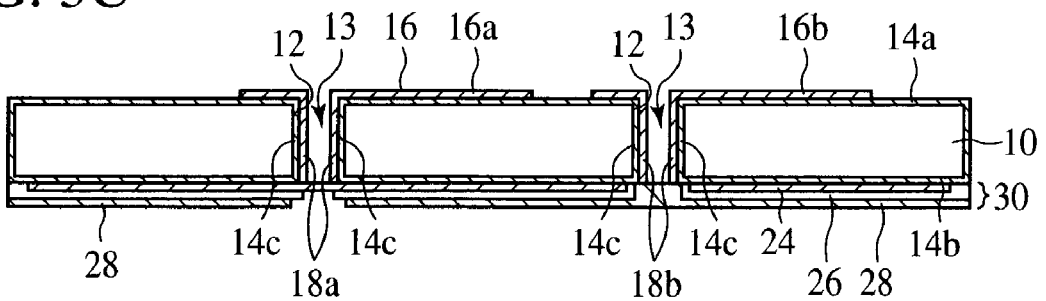

Next, a BST film is formed on the electrodes 24 formed on the underside of the silicon substrate 10 by, e.g., sol-gel process. Then, the BST film is patterned in a prescribed shape. Thus, the dielectric film 26 of BST is formed. Then, the electrodes 28 of the conducting film are formed on the dielectric film 26. Thus, the capacitors 30 are formed on the underside of the silicon substrate 10 (FIG. 3C).

The electrodes 24, 28 forming the capacitors 30 cover the undersides of the through-holes 12, whereby the circuit substrate can retain high mechanical strength.

Then, a solder resist film is formed by, e.g., printing on the upper surface of the silicon substrate 10 with the interconnections 16a, 16b formed on.

Figure 3D:
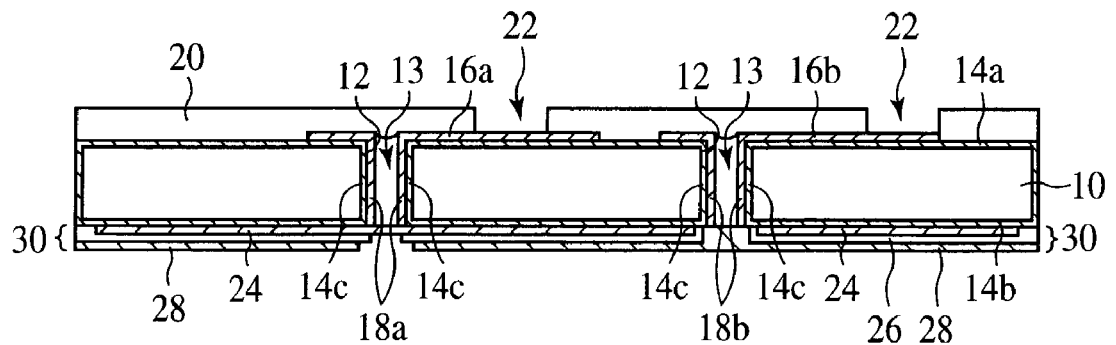

Next, the solder resist is patterned. Thus, the circular openings 22 of a 110 µm-diameter are formed at a prescribed pitch down to the interconnections 16a, 16b. Thus, the organic resin film 20 is formed on the upper surface of the silicon substrate 10 with the interconnections 16a, 16b formed on, covering the openings 13 of the through-holes 12 (FIG. 3D).

As described above, the circuit substrate according to the present embodiment is fabricated.

In fabricating the conventional circuit substrate, metal is buried substantially completely in the through-holes by plating or others. Accordingly, the fabrication of the conventional circuit substrate takes long time; for example, it takes about 60 hours to bury metal in the through-holes of a 50 µm-diameter and a 300 µm-depth by plating.

In contrast to this, according to the present embodiment, the conducting films 18a, 18b, 18c are formed on the inside walls of the through-holes 12 in place of burying metal completely in the through-holes 12, which can drastically reduce the fabrication time in comparison with that of the conventional circuit substrate.

As described above, according to the present embodiment, the through-holes 12 are formed in the silicon substrate 10 by lithography, which allows the through-holes 12 to be formed, micronized at a small pitch. The circuit substrate can be fabricated applicable to high-density packaging. In forming the through-holes 12, the silicon substrate 10 is selectively etched without etching the silicon oxide film 14b formed on the underside of the silicon substrate 10, whereby the silicon substrate 10 is reinforced and is prevented from breaking. The organic resin film 20 is formed, covering the openings 13 of the through-holes 12, whereby the circuit substrate can retain the mechanical strength high.

[A Second Embodiment]

Figure 4A:
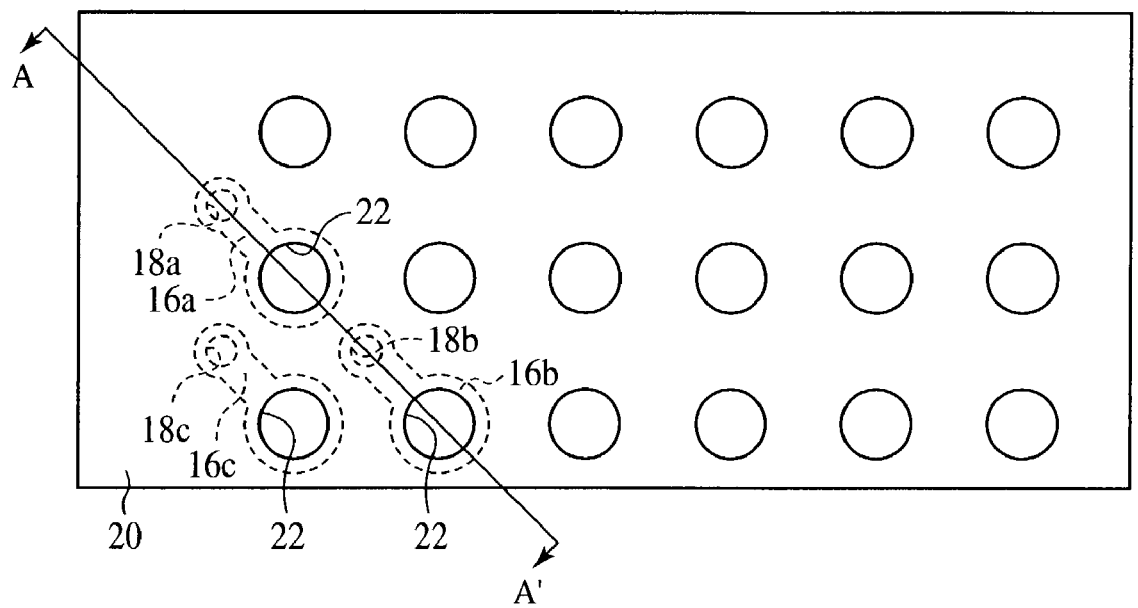
FIGS. 4A and 4B are diagrammatic views of the circuit substrate according to a second embodiment of the present invention, which show a structure thereof.
Figure 4B:
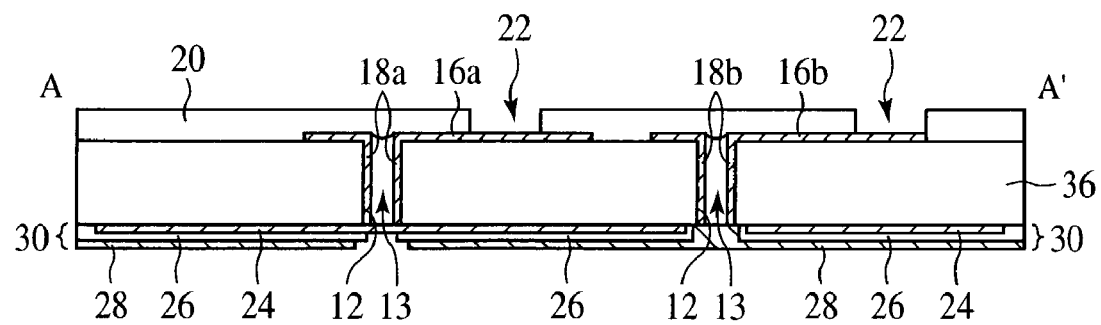

The circuit device according to a second embodiment of the present invention and a method for fabricating the circuit device will be explained with reference to FIGS. 4A, 4B, 5A, 5B, 5C, and 5D. FIGS. 4A and 4B are diagrammatic sectional views of the circuit substrate according to the present embodiment. FIGS. 5A, 5B, 5C, and 5D are sectional views of the circuit substrate according to the present embodiment in the steps of the method for fabricating the circuit substrate, which explain the method. The same members of the present embodiment as those of the circuit substrate according to the first embodiment shown in FIGS. 1A, 1B, 2A, 2B, 2C, 2D, 3A, 3B, 3C, and 3D are represented by the same reference numbers not to repeat or to simplify their explanation.

First, the circuit substrate according to the present embodiment will be explained with reference to FIGS. 4A and 4B. FIG. 4A is an upper side view of the circuit substrate according to the present embodiment. FIG. 4B is the sectional view along the line A–A' in FIG. 4A.

The circuit substrate according to the present embodiment is characterized mainly in that the silicon substrate 10 is replaced by a glass substrate 36.

In the circuit substrate according to the first embodiment, a silicon substrate 10 is used. To form on the silicon substrate 10 the interconnections 16a, 16b, 16c, the conducting films 18a, 18b, 18c and the electrodes 24 it is necessary to form the silicon oxide films 14a, 14b, 14c on the surfaces of the silicon substrate 10 for insulation.

However, in the circuit substrate according to the present embodiment, a glass substrate 36 is used. This makes it possible to ensure the insulation without forming the insulation films, such as silicon oxide films, etc., on the surfaces of the glass substrate 16 as shown in FIGS. 4A and 4B, as are formed in the first embodiment. Accordingly, this can make the structure simple.

Then, the method for fabricating the circuit substrate according to the present embodiment will be explained with reference to FIGS. 5A, 5B, 5C, and 5D.

First, a conducting film 34 is formed on the underside of the glass substrate 36 of, e.g., a 300 µm-thickness by CVD, sputtering or others.

In the present embodiment a glass substrate 36 is used, as is not used in the first embodiment. Accordingly, it is not necessary to form insulation films, such as silicon oxide films, etc. before the conducting film is formed, as is necessary in the first embodiment, where a silicon substrate 10 is used.

Figure 5A:
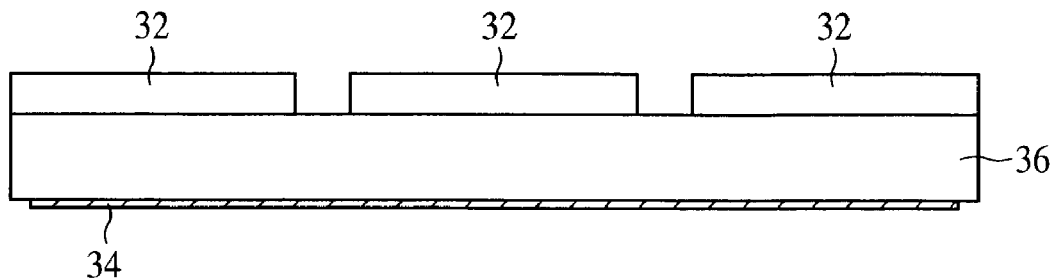
FIGS. 5A, 5B, 5C, and 5D are sectional views of the circuit substrate according to the second embodiment of the present invention in the steps of the method for fabricating the circuit substrate, which show the method.

Next, a resist film 32 is formed on the upper surface of the glass substrate 36. Then, a pattern for forming through-holes 12 are formed by photolithography (FIG. 5A).

Figure 5B:
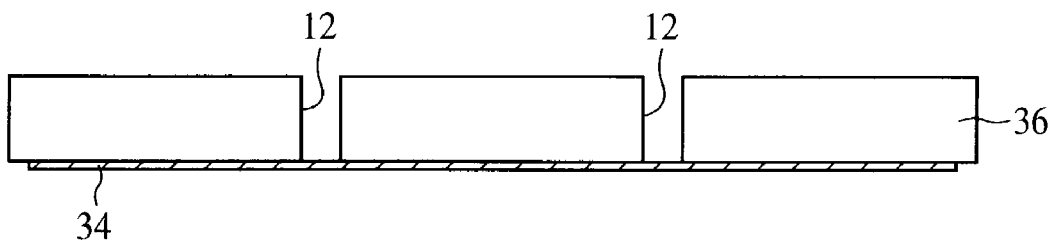
Figure 5C:
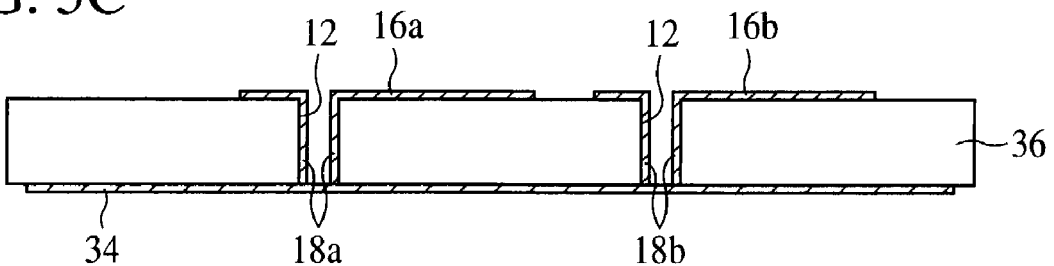

Then, the glass substrate 36 is etched by RIE at a high selectivity ratio with respect to the conducting film 34. Thus, the through-holes 12 are formed in the glass substrate 36. The conducting film 34 formed on the underside of the glass substrate 36 remains not etched (FIG. 5B).

The glass substrate 36 is selectively etched without etching the conducting film 34 formed on the underside of the glass substrate 36, whereby the glass substrate 36 is reinforced by the conducting film 34. Even in a case where the through-holes 12 are formed, micronized at a small pitch, the glass substrate 36 is prevented from breaking.

Next, in the same way as in the first embodiment, conducting films 18a, 18b, 18c are formed on the inside walls of the through-holes 12 while interconnections 16a, 16b are formed on the upper surface of the glass substrate 36.

Then, the conducting film 34 formed on the underside of the glass substrate 36 is patterned in a shape of the electrodes 24. Thus, the electrodes 24 are formed of the conducting film 34.

Next, a BST film is formed by, e.g., sol-gel process on the electrodes 24 formed on the underside of the glass substrate 36. Next, the BST film is patterned in a prescribed shape. Thus, a dielectric film 26 is formed of the BST film. Then, electrodes 28 are formed of the conducting film on the dielectric film 26. Thus, capacitors 30 are formed on the underside of the glass substrate 36.

The electrodes 24, 28 forming the capacitors cover the underside of the through-holes 12, whereby the circuit substrate can retain the mechanical strength high.

Next, a solder resist film is formed by, e.g., printing, on the upper surface of the glass substrate 36 with the interconnections 16a, 16b formed on.

Figure 5D:
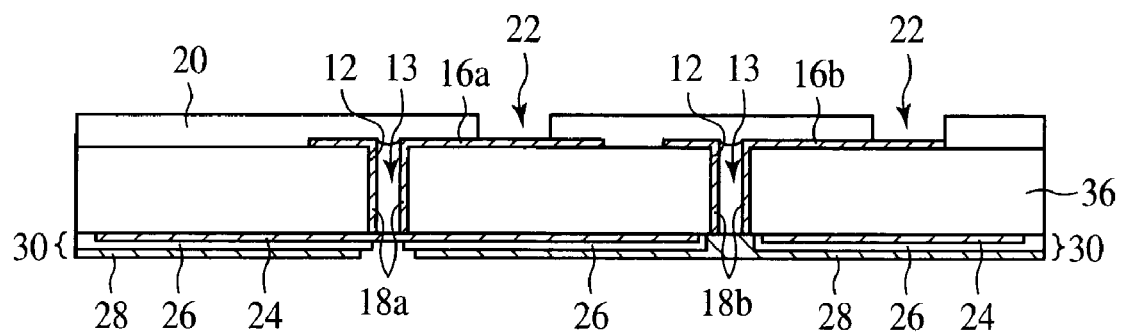

Then, the solder resist film is patterned. Thus, circular openings 22 of a 110 µm-diameter are formed down to the interconnections 16a, 16b at a prescribed pitch. Thus, an organic resin film 20 is formed on the upper surface of the glass substrate 36 with the interconnections 16a, 16b formed on, covering the openings 13 of the through-holes 12 (FIG. 5D).

As described above, the circuit substrate according to the present embodiment is fabricated.

As described above, according to the present embodiment, when the through-holes 12 are formed, the glass substrate 36 is selectively etched without etching the conducting film 34 formed on the underside of the glass substrate 36, whereby the glass substrate 36 is reinforced, and is prevented from breaking. A glass substrate, which is dielectric, is used, which makes it unnecessary to additionally form insulation films on the surfaces of the glass substrate 36. The fabrication process can be simpler than the first embodiment.

[Modifications]

The present invention is not limited to the above-described embodiments and can cover other various modifications.

In the above-described embodiments, a silicon substrate 10 and a glass substrate 36 are used, but the silicon substrate 10 and the glass substrate 36 are not essential. All other substrates can be used.

In the above-described embodiments, the organic resin film 20 is formed on only one surface of the silicon substrate 10 and on only one surface of the glass substrate 36, but may be formed on both surfaces of the silicon substrate 10 and on both surfaces of the glass substrate 36.

Figure 6:
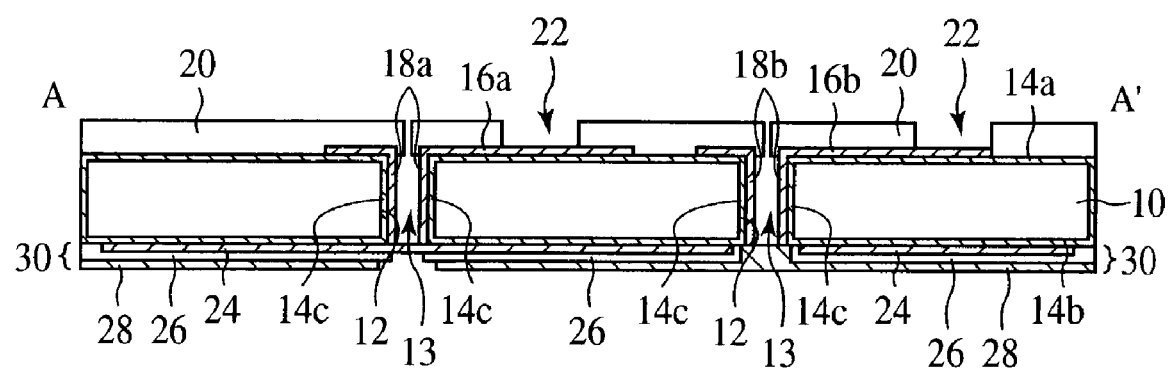
FIG. 6 is a sectional view of one modification of the circuit substrate according to the present invention, which shows the structure thereof.
Figure 7A:
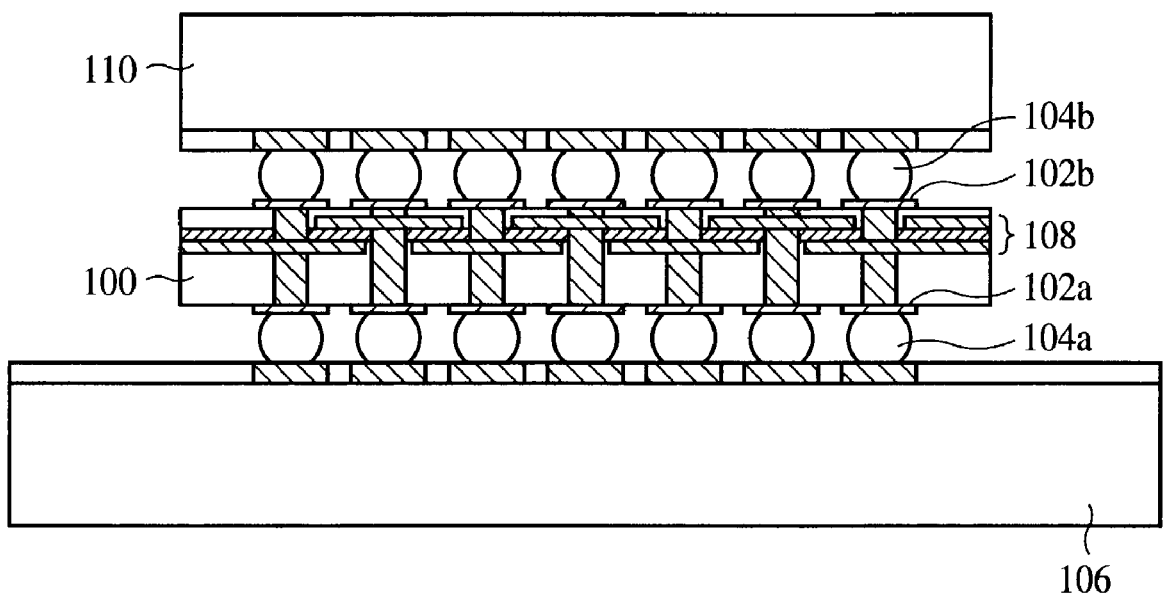
FIGS. 7A and 7B are diagrammatic views of the conventional circuit substrate, which show a structure thereof.
Figure 7B:
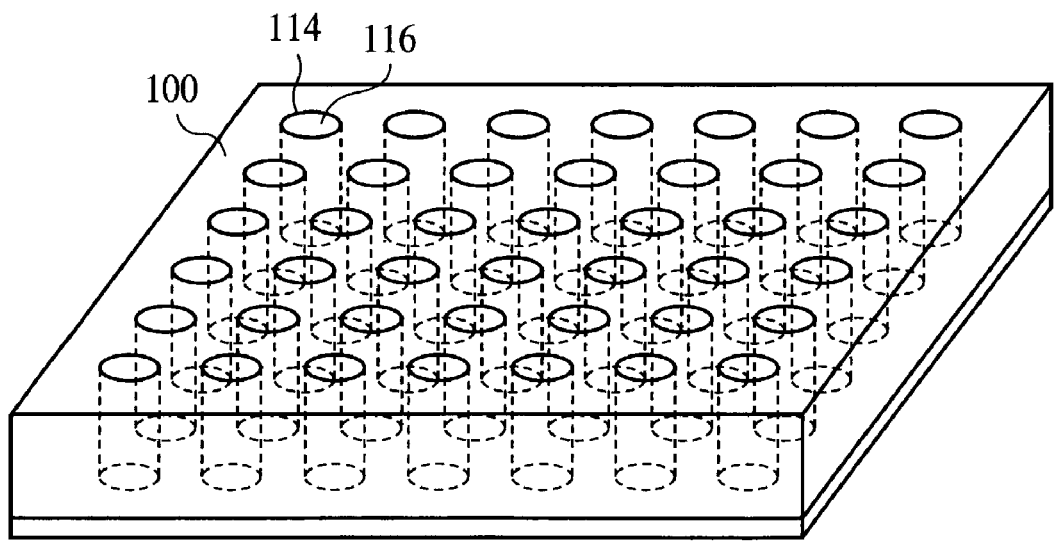

In the above-described embodiments, the openings 13 of the through-holes 12 are completely covered by the organic resin film 20 but may not be completely covered. For example, the openings 13 may be partially covered. As exemplified in FIG. 6, openings may be formed in the organic resin film 20 covering the openings 13 of the through-holes 12. In this case, the organic resin film 20 is formed, covering the openings 13 of the through-holes 12, and then the organic resin film 20 is opened by, e.g., photolithography at the parts near the centers of the openings 13 of the through-holes 12. The openings are formed in the organic resin film 20 covering the openings 13 of the through-holes 12, whereby the air in the through-holes 12 can be freely discharged in later thermal processing, etc. This prevents the organic resin film 20, etc. from being damaged due to expansion of the air in the through-holes 12.

In the above-described embodiments, the organic resin film 20 is used to reinforce the strength of the circuit substrate. However, the organic resin film 20 is not essential, and any other film may be used as long as the film can cover the openings 13 of the through-holes 12 to thereby reinforce the circuit substrate.

In the above-described embodiments, the through-holes 12 are formed by RIE. However, RIE is not essential, and any other etching may be used.

In the above-described embodiments, the through-holes 12 are formed by etching. However, the etching is not essential, and the through-holes 12 may be formed by, e.g., blasting steel particles, sand or other abrasive grain to the substrates by sandblasting.

In the above-described embodiments, the interconnections 16 are formed on the upper surfaces of a silicon substrate 10 and a glass substrate 36, and the electrodes 24, the dielectric films 26 and the electrodes 28 are formed on the undersides of the substrates. However, this is not essential, and interconnections, etc. can be suitably formed.

In the above-described embodiments, the capacitors 30 are formed on the circuit substrate, but other passive elements and active elements may be formed on the circuit substrate.

In the first embodiment, the silicon oxide films 14a, 14b, 14c are formed as insulation films on both surfaces of a silicon substrate 10 and on the inside walls of the through-holes 12. However, the silicon oxide films 14a, 14b, 14c are not essential, and other insulation films, such as silicon nitride film, etc., may be formed.

What is claimed is:

1. A circuit substrate comprising:
    a substrate having a first through-hole formed therein;
    a reinforcing film of an organic resin formed only on the surface of at least one side of the substrate, covering the opening of the first through-hole and exposed to the cavity inside the first through-hole, the reinforcing film having a second through-hole formed therein with a diameter wider than the first through-hole and a third through-hole formed in a part of the reinforcing film which covers the opening of the first through-hole;
    an element formed on the underside of the substrate; and
    a conducting film formed continuously on the inside wall of the first through-hole and on the surface of the substrate below the reinforcing film, and exposed in the cavity inside the first through-hole and in the bottom of the second through-hole, for electrically connecting the element from the first through-hole to the second through hole.

2. A circuit substrate according to claim 1, further comprising an interconnection layer formed between the substrate and the reinforcing film and electrically connected to the conducting film.

3. A circuit substrate according to claim 2, wherein the conducting film is electrically connected to the outside via the interconnection layer.

4. A circuit substrate according to claim 2, further comprising another conducting film formed on the surface of the other side of the substrate and electrically connected to the conducting film.

5. A circuit substrate according to claim 4, wherein the through-hole is covered by said another conducting film.

6. A circuit substrate according to claim 1, further comprising another conducting film formed on the surface of the other side of the substrate and electrically connected to the conducting film.

7. A circuit substrate according to claim 6, wherein the through-hole is covered by said another conducting film.

8. A circuit substrate according to claim 6, wherein said another conducting film is one of the electrodes of a capacitor.

9. A method for fabricating a circuit substrate comprising the steps of:
    forming a first through-hole in a substrate;
    forming a conducting film on the inside wall of the through-hole, exposed in the cavity inside the through-hole;
    forming a reinforcing film of an organic resin on the surface of at least one side of the substrate, covering the opening of the through-hole and forming a second through-hole in the reinforcing film having a diameter wider than that of the first through-hole and forming a third through-hole in a part of the reinforcing film which covers the opening of the first through-hole.

10. A method for fabricating a circuit substrate according to claim 9,
    further comprising, prior to the step of forming the through-hole, the step of forming on said surface of one side of the substrate a film whose etching characteristics are different from the substrate,
    wherein in the step of forming the through-hole, the substrate is etched from the surface of the other side of the substrate to form the through-hole.

11. A method for fabricating a circuit substrate according to claim 10, wherein in the step of forming the conducting film, the conducting film is formed on the inside wall of the through-hole by plating.

12. A method for fabricating a circuit substrate according to claim 9, wherein in the step of forming the through-hole, the through-hole is formed in the substrate by sandblasting.

13. A method for fabricating a circuit substrate according to claim 9, wherein in the step of forming the conducting film, the conducting film is formed on the inside wall of the through-hole by plating.

14. A method for fabricating a circuit substrate according to claim 13,
further comprising, prior to the step of forming the conducting film, the step of applying and drying a liquid containing metal micronized particles to affix the metal micronized particles to the inside wall of the through-hole.

15. A method for fabricating a circuit substrate according to claim 9, wherein in the step of forming the reinforcing film, an organic resin having a viscosity of above 20000 mPa·s is applied to the substrate to form the reinforcing film of the organic resin.

16. A method for fabricating a circuit substrate according to claim 9, wherein in the step of forming the reinforcing film, a film is affixed to the substrate to form the reinforcing film of the film.

17. A method for fabricating a circuit substrate according to claim 9, further comprising, posterior to the step of forming the reinforcing film, the step of forming an opening in the reinforcing film down to the through-hole.

18. A circuit substrate comprising:

a substrate having a first through-hole formed therein;

a reinforcing film of an organic resin formed on the surface of at least one side of the substrate and covering the opening of the first through-hole, the cavity inside the first through-hole not being filled with the reinforcing film, the reinforcing film having a second through-hole formed therein with a diameter wider than the first through-hole and a third through-hole formed in a part of the reinforcing film which covers the opening of the first through-hole;

an element formed on the underside of the substrate; and a conducting film formed continuously on the inside wall of the first through-hole and on the surface of the substrate below the reinforcing film, and exposed in the cavity inside the first through-hole and in the bottom of the second through-hole, for electrically connecting the element from the first through-hole to the second through-hole.

* * * * *